(12) United States Patent
Roohparvar

(10) Patent No.: US 7,436,708 B2
(45) Date of Patent: Oct. 14, 2008

(54) NAND MEMORY DEVICE COLUMN CHARGING

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 11/276,480

(22) Filed: Mar. 1, 2006

(65) Prior Publication Data

US 2007/0206422 A1   Sep. 6, 2007

(51) Int. Cl.
*G11C 11/34* (2006.01)
(52) U.S. Cl. .................. 365/185.18; 365/205
(58) Field of Classification Search ............ 365/185.18, 365/205
See application file for complete search history.

(56) References Cited

U.S. PATENT DOCUMENTS

| | | |
|---|---|---|
| 5,041,886 A | 8/1991 | Lee |
| 5,243,700 A | 9/1993 | Larsen et al. |
| 5,453,957 A | 9/1995 | Norris et al. |
| 5,522,086 A | 5/1996 | Burton et al. |
| 5,537,354 A | 7/1996 | Mochizuki et al. |
| 5,600,605 A | 2/1997 | Schaefer |
| 5,642,480 A | 6/1997 | Brownlee et al. |
| 5,666,321 A | 9/1997 | Schaefer |
| 5,751,039 A | 5/1998 | Kauffman et al. |
| 5,768,199 A | 6/1998 | Inoue |
| 5,787,457 A | 7/1998 | Miller et al. |
| 5,892,777 A | 4/1999 | Nesheiwat et al. |
| 5,936,903 A | 8/1999 | Jeng et al. |
| 5,986,943 A | 11/1999 | Isa |
| 5,995,438 A | 11/1999 | Jeng et al. |
| 6,026,465 A | 2/2000 | Mills et al. |
| 6,046,940 A | 4/2000 | Takeuchi et al. |
| 6,058,044 A * | 5/2000 | Sugiura et al. ......... 365/185.17 |
| 6,064,627 A | 5/2000 | Sakurai |
| 6,073,204 A | 6/2000 | Lakhani et al. |
| 6,119,210 A | 9/2000 | Leon et al. |
| 6,137,133 A | 10/2000 | Kauffman et al. |
| 6,141,247 A | 10/2000 | Roohparvar et al. |
| 6,191,994 B1 | 2/2001 | Ooishi |
| 6,240,020 B1 | 5/2001 | Yang et al. |

(Continued)

FOREIGN PATENT DOCUMENTS

EP   929075 A1   7/1999

(Continued)

OTHER PUBLICATIONS

"International Search Report issued in PCT/US2007/004990 on Sep. 6, 2007", (Sep. 6, 2007),6 pages.

(Continued)

*Primary Examiner*—Michael T Tran
(74) *Attorney, Agent, or Firm*—Schwegman, Lundberg & Woessner, P.A.

(57) ABSTRACT

Embodiments of NAND Flash memory devices and methods recognize that effective column coupling capacitance can be reduced by maintaining a sourced voltage on adjacent columns of an array. Maintaining the columns in a charged state prior to array operations (read, write, and program) reduces current surges and improves data read timing. Devices and methods charge the array columns at pre-charge and following array access operations.

17 Claims, 3 Drawing Sheets

U.S. PATENT DOCUMENTS

| | | |
|---|---|---|
| 6,279,069 B1 | 8/2001 | Robinson et al. |
| 6,295,640 B1 | 9/2001 | Eidt |
| 6,327,663 B2 | 12/2001 | Isaac et al. |
| 6,378,018 B1 | 4/2002 | Tsern et al. |
| 6,401,163 B1 | 6/2002 | Kondo et al. |
| 6,510,081 B2 * | 1/2003 | Blyth et al. ............. 365/185.12 |
| 6,980,471 B1 * | 12/2005 | Samachisa ............. 365/185.02 |
| 7,054,992 B2 | 5/2006 | Roohparvar |
| 7,196,933 B2 * | 3/2007 | Shibata .................. 365/185.22 |
| 2001/0038547 A1 | 11/2001 | Jigour et al. |
| 2002/0056063 A1 | 5/2002 | Nerl |
| 2003/0051093 A1 * | 3/2003 | Takeuchi .................... 711/103 |
| 2005/0050235 A1 * | 3/2005 | Choi ............................. 710/5 |
| 2005/0226046 A1 * | 10/2005 | Lee et al. ................ 365/185.12 |
| 2006/0146612 A1 * | 7/2006 | Lim et al. ............... 365/185.21 |
| 2006/0161724 A1 * | 7/2006 | Bennett et al. ............... 711/103 |
| 2006/0161728 A1 * | 7/2006 | Bennett et al. ............... 711/103 |

FOREIGN PATENT DOCUMENTS

| | | |
|---|---|---|
| WO | WO-0175890 A2 | 10/2002 |
| WO | WO-0142929 A1 | 6/2007 |
| WO | WO-2007103045 A2 | 9/2007 |

OTHER PUBLICATIONS

"Written Opinion issued in PCT/US2007/004990 on Sep. 6, 2007", (Sep. 6, 2007), 5 pages.

* cited by examiner

NAND MEMORY DEVICE COLUMN CHARGING

FIELD OF THE INVENTION

The present invention relates to non-volatile memory devices and, more particularly, to NAND flash memory devices.

BACKGROUND

Flash memory is non-volatile, which means that it stores information on a semiconductor in a way that does not need power to maintain the information in the chip. Flash memory stores information in an array of transistors, called "cells," each of which stores one or more bits of information. The memory cells are based on the Floating-Gate Avalanche-Injection Metal Oxide Semiconductor (FAMOS transistor) which is essentially a Complimentary Metal Oxide Semiconductor (CMOS) Field Effect Transistor (FET) with an additional conductor suspended between the gate and source/drain terminals. Current flash memory devices are made in two basic array architectures: NOR flash and NAND flash. The names refer to the type of logic used in the storage cell array.

A flash cell is similar to a standard MOSFET transistor, except that it has two gates instead of just one. One gate is the control gate (CG) like in other MOS transistors, but the second is a floating gate (FG) that is insulated all around by an oxide layer. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cell's source and drain connections, depending on the Vt of the cell. This presence or absence of current can be sensed and translated into 1's and 0's, reproducing the stored data.

Memory cells of memory devices are typically arranged in an array with rows and columns. Generally, the rows are coupled via a word line conductor and the columns are coupled via a bit line conductor. During data read functions the bit line conductors are pre-charged to a selected voltage level. As the population of NAND memory devices increases, issues with memory cell to memory cell coupling, column to column coupling, current consumption, operating performance and data accuracy are all experienced.

For reasons stated below which will become apparent to those skilled in the art upon reading and understanding the present specification, there is a need for improving performance of NAND memory read operations.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dice, as is well known in the art. The figures are provided to help facilitate an understanding of the detailed description, are not intended to be accurate in scale, and have been simplified. The term conductor as used herein is intended to include conductors and semi-conductors, including but not limited to metals, metal alloy, doped silicon and polysilicon. The following detailed description is, therefore, not to be taken in a limiting sense, and the scope of the present invention is defined only by the appended claims, along with the full scope of equivalents to which such claims are entitled.

Figure 1:
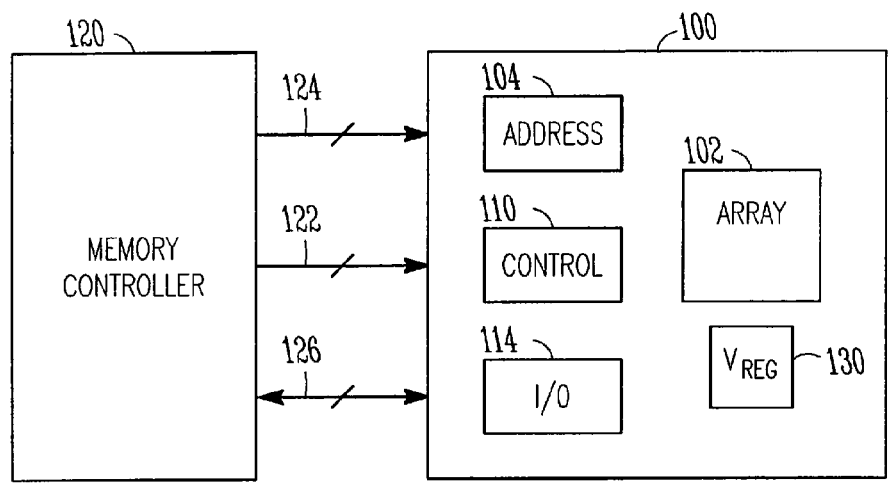
FIG. 1 is a block diagram of a memory device according to embodiments of the present invention.

FIG. 1 is a simplified block diagram of an integrated circuit memory device 100 in accordance with an embodiment of the invention. The memory device 100 includes an array of non-volatile floating gate memory cells 102, address circuitry 104, control circuitry 110, and Input/Output (I/O) circuitry 114. The memory cells are also referred to as Flash memory cells because blocks of memory cells are typically erased concurrently, in a 'flash' operation.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, digital cameras, personal digital assistants (PDA's) and audio recorders.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data can be written to or read from the memory cells across data, DQ, lines 126.

The control circuitry 110 is illustrated generally as a block of circuitry that includes circuitry to perform numerous memory array and peripheral operations. It will be appreciated that the control circuitry for the memory device is not a discreet circuit, but comprises circuits that are distributed throughout the memory. The control circuitry in one embodiment includes circuitry to perform read, erase and write operations on the memory array.

A voltage regulator 130 provides one or more regulated voltages for use in the memory device. The voltage regulator can provide positive or negative voltages. In one embodiment the regulator provides a predetermined voltage to charge conductors of the array, such as column bit lines as explained below.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

Figure 2:
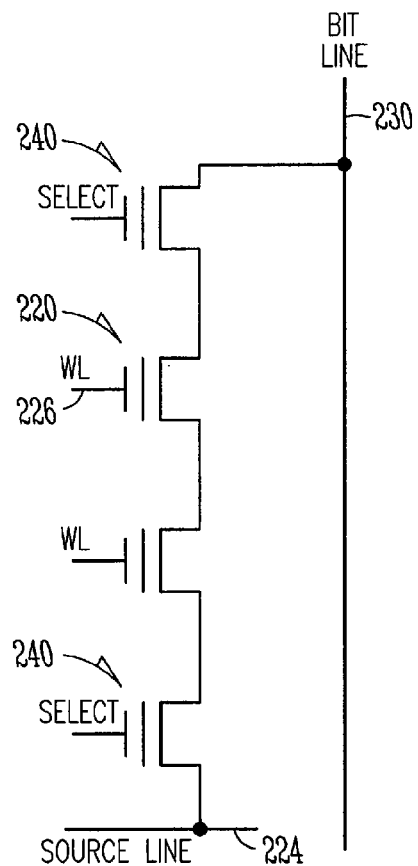
FIG. 2 illustrates a simplified portion of a prior art NAND flash memory array.

FIG. 2 illustrates a simplified portion of a prior art NAND flash memory array. NAND Flash uses tunnel injection for writing and tunnel release for erasing. The NAND memory includes floating gate memory cells 220 coupled to a source line 224, word lines 226 and a bit line 230. The cells are coupled in series between the bit line and source line. One or more bit line select transistors 240 are used to selectively isolate the cells from the bit and source lines.

In a read operation, a word line of a target (selected) memory cell can be maintained at a low voltage level. All unselected cell word lines are coupled to a voltage sufficiently high to activate the unselected cells regardless of their floating gate charge. If the selected cell has an uncharged floating gate, it is activated. The bit line and source line are then coupled through the series of memory cells. If the selected cell has a charged floating gate, it will not activate. The bit line and source lines, therefore, are not coupled through the series of memory cells.

Because of the close proximity of the memory cells, bit line coupling can be a problem during reading/sensing operations. That is, the length and close spacing of adjacent bit lines results in voltage noise on bit lines. Of particular concern is bit line coupling during write verify operations. As known to those skilled in the art, a write operation typically includes one or more program steps and one or more read/verify steps.

To address the bit line coupling issue, prior art NAND flash memories divide word lines (rows) into two logical pages. The pages are interwoven such that alternating bit lines of an array belong to different pages. During operation, one page can be active and the other page can be inactive. The bit lines of the inactive page are coupled to a high potential, such as Vcc, during a program operation. The Vcc biased bit lines, therefore, prevent memory cells coupled to a common word line from being programmed.

In prior art NAND memory devices the column or bit lines of the inactive page are discharged to a ground potential and the columns of the active page are pre-charged to a high potential, such as Vcc, prior to reading a memory page. The grounded columns provide some protection from column cross-talk. A single level prior art NAND memory can be read in about 25 micro-seconds, while a multi-level NAND memory can take in excess of 50 micro-seconds to read.

Several issues have been experienced with the above NAND memory design as a result of the increased population of current memory devices combined with the operational specifications for NAND memories. The pre-charge operation can result in a current surge. For example, a NAND memory with 32,000 columns can have 50 to 75 nano-Farads (nF) of capacitance for one-half of the array columns (3-5 pico-Farads per column). To charge 75 nF to one volt in 1 micro-second requires an average of 75 milli-amps. Because of peak current restrictions, prior art NAND memory devices stager the column pre-charge operation. As a result, the total read/verify operation can be significantly slower than desired. In addition to slower performance, multi-level NAND cells are sensitive to internal voltage regulator surges caused by the pre-charge operation.

The coupling capacitance between columns of prior NAND memory devices is large. Embodiments of the present invention recognize that the effective column coupling capacitance can be reduced by maintaining a sourced voltage on adjacent columns. Further, maintaining the columns in a charged state prior to array operations (read, write, and program) reduces current surges and improves data read timing.

In operation, the NAND memory columns are charged to a positive voltage, such as Vcc, upon power-up of the device. As such, the columns are charged prior to the first array operation. After the array operation is performed, the columns are re-charged in anticipation for subsequent array operations.

Figure 3:
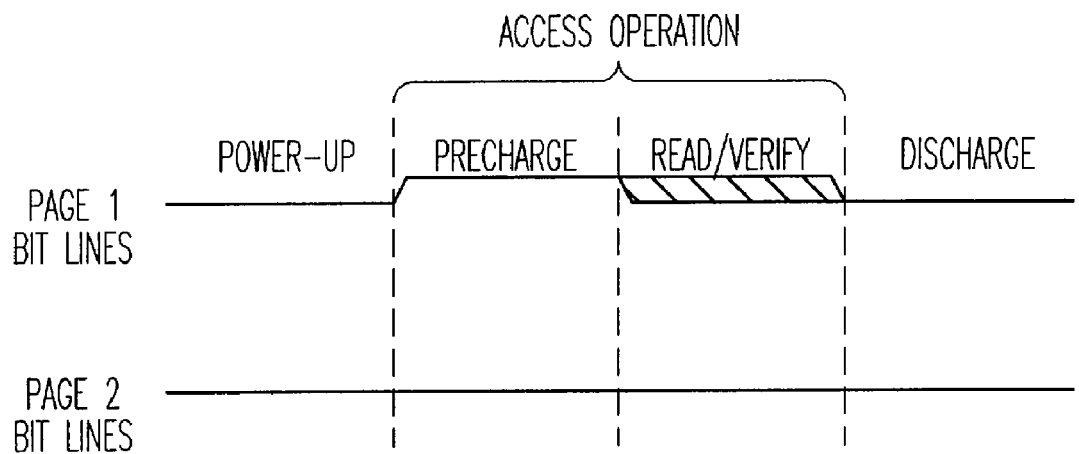
FIG. 3 is a simplified timing diagram of prior art NAND memory operations.
Figure 4:
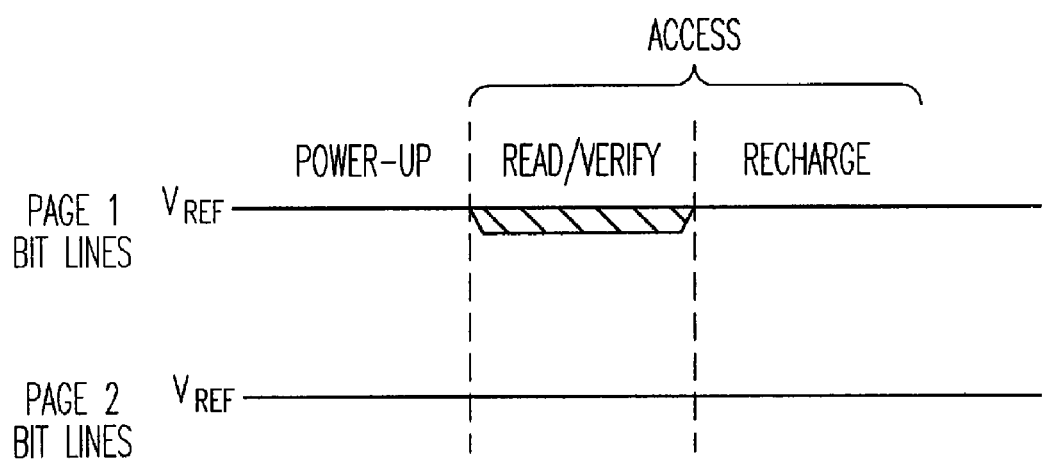
FIG. 4 is a simplified timing diagram of a NAND memory according to embodiments of the present invention.

Referring to FIGS. 3 and 4, prior art NAND memory functions and an embodiment of the present invention are compared. In FIG. 3, the prior art NAND memory device includes bit lines arranged in accessible Pages 1 and 2. The memory is powered-up and the page bit lines are coupled to a ground potential (un-charged). During an access operation of the array to Page 1, the column bit lines of Page 1 are selectively pre-charged. Page 2 bit lines remain uncharged. That is, while executing a read, or verify operation on Page 1, the column bit lines corresponding to a selected memory page are first pre-charged, while adjacent column bit lines corresponding to an unselected memory page remain uncharged. After pre-charging the bit lines, the Page 1 is accessed using a word line (row) and the bit line voltages are sensed, as described above. Following the sensing operation, the bit lines of Page 1 are discharged to remove any residual charge.

In FIG. 4, a NAND memory device of an embodiment also includes two Pages, Page 1 and Page 2. During operation, the memory is powered-up and all of the column bit lines of Pages 1 and 2 are coupled to a predetermined positive voltage (Vref) to pre-charge the bit lines. The voltage level is dependant upon memory device specification and fabrication, as such the present invention is not limited to a specific voltage or voltage range. Because the bit lines are charged at power-up, executing a read, or verify operation on Page 1 during an access operation proceeds to accessed memory cells using a word line (row) and sensing the bit line voltage. The bit lines of Page 2 remain charged during the access of Page 1. Following the sensing operation on Page 1, the bit lines are re-charged to place the columns into the charged state.

Figure 5:
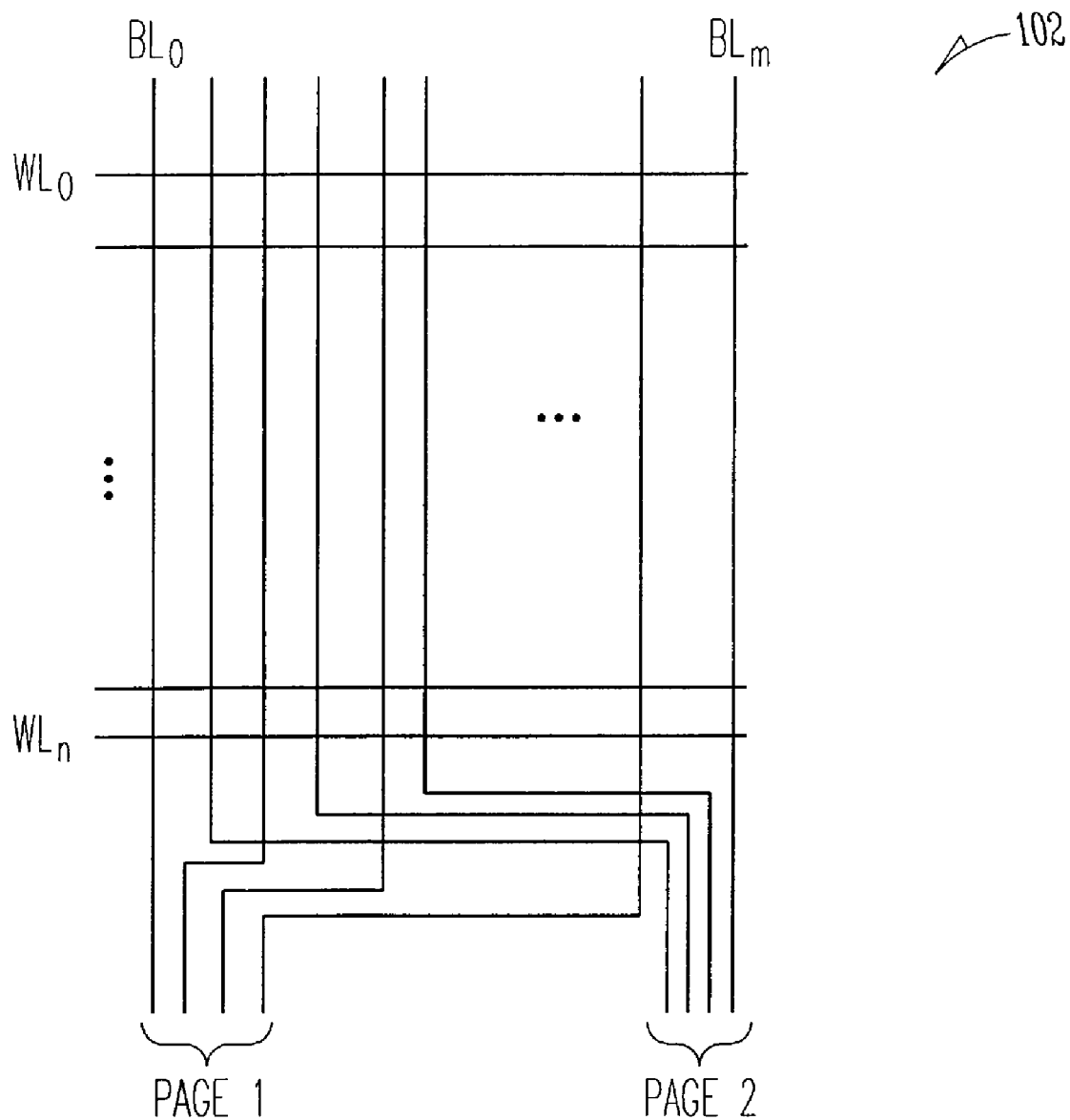
FIG. 5 illustrates array bit lines of the memory of FIG. 1.

Referring to FIG. 5, a simplified array of FIG. 1 is described. In one embodiment, a NAND flash memory includes an array of memory cells arranged in accessible rows and columns, wherein each column of memory cells are coupled to a bit line ($BL0$-$BL_M$). A voltage regulator circuit 130 (FIG. 1) provides a predetermined voltage and control circuitry 110 performs a read operation on a column, such as BL2 of the array of memory cells. The array is illustrated as having alternate columns assigned to different accessible pages when accessed using a word line $WL0$-$WL_N$. The even bit lines are assigned in the illustrated array to Page 1 and the odd bit lines to Page 2.

The read operation comprises sensing a voltage level of the bit line associated with the column being read, and charging the bit line to the predetermined voltage provided by voltage regulator circuit 130 following sensing the voltage level of the bit line. The control circuitry and voltage regulator circuit can charge the bit line to the predetermined voltage during a power-up operation of the memory device. In another embodiment, the control circuitry maintains a charge on first and second adjacent bit lines BL1 and BL3 located adjacent to and on opposite lateral sides of the bit line BL2 associated with the column being read while sensing the voltage level of BL2. Each memory cell of the array can store one data bit, or multiple bits of data using multiple voltage levels of the memory cell.

In another embodiment, a method of operating a NAND flash memory device includes powering up the memory device in response to an externally supplied power. All column bit lines $BL0$-$BL_M$ of the first and second data pages of an array of the memory are charged to a predetermined positive voltage level following powering up. A read operation is performed on the first data page while all column bit lines of the second data page are charged to the predetermined positive voltage level. The read operation includes accessing a row of memory cells by activating a word line conductor of the first data page such as WL0, and sensing a voltage potential of column bit lines of the first data page after accessing the row. All column bit lines of the first data page are re-charged to the predetermined positive voltage level following sensing the voltage potential of the column bit lines of the first data page.

The invention claimed is:

1. A method of operating a NAND flash memory device comprising:
   powering up the memory device in response to an externally supplied power;
   charging all colunm bit lines of first and second data pages of an array of the memory to a predetermined positive voltage level following powering up;
   performing a read operation on the first data page while all column bit lines of the second data page are charged to the predetermined positive voltage level,
   wherein the read operation comprises:
      accessing a row of memory cells by activating a word line conductor of the first data page; and
      sensing a voltage potential of column bit lines of the first data page after accessing the row; and
   charging all column bit lines of the first data page to the predetermined positive voltage level following sensing the voltage potential of the column bit lines of the first data page.

2. The method of claim 1, further comprising storing multiple bits of data in a memory cell of the array using multiple voltage levels.

3. The method of claim 1, wherein charging includes charging all column bit lines of first and second data pages to about one volt.

4. A method of operating a NAND flash memory device comprising:
   charging all column bit lines of first and second data pages of an array of the memory to a predetermined positive voltage level prior to performing an array access operation;
   performing a read operation on the first data page while all column bit lines of the second data page are charged to the predetermined positive voltage level; and
   powering up the memory device in response to an externally supplied power, and wherein charging all column bit lines of the first and second data pages is performed as a step of powering up the memory device.

5. The method of claim 4 wherein the read operation comprises:
   accessing a row of memory cells by activating a word line conductor of the first data page; and
   sensing a voltage potential of column bit lines of the first data page after accessing the row.

6. The method of claim 4, wherein charging includes supplying the predetermined voltage to the column bit lines of first and second data pages with a voltage regulator circuit.

7. The method of claim 6, wherein charging includes charging all column bit lines of first and second data pages to about one volt.

8. A method of operating a NAND flash memory device comprising:
   powering up the memory device in response to an externally supplied power;
   charging all column bit lines of first and second data pages of an array of the memory to a predetermined positive voltage level following powering up;
   performing a read operation on the first data page while all column bit lines of the second data page are charged to the predetermined positive voltage level, wherein the read operation comprises accessing a row of memory cells by activating a word line conductor of the first data page, and sensing a voltage potential of column bit lines of the first data page after accessing the row; and
   re-charging all column bit lines of the first data page to the predetermined positive voltage level following sensing the voltage potential of the column bit lines of the first data page.

9. The method of claim 8 wherein each memory cell of the array stores multiple bits of data using multiple voltage levels of the memory cell.

10. A NAND flash memory device comprising:
    an array of memory cells arranged in accessible rows and columns, wherein each column of memory cells are coupled to a corresponding bit line;
    control circuitry to perform a read operation on a column of the array of memory cells, wherein the read operation comprises sensing a voltage level of the bit line associated with the column being read, and charging the bit line to a predetermined voltage following sensing the voltage level of the bit line; and
    wherein the control circuitry charges the bit line to the predetermined voltage during a power-up operation of the memory device.

11. The NAND flash memory device of claim 10 wherein the control circuitry maintains a charge on first and second adjacent bit lines located adjacent to and on opposite lateral sides of the bit line associated with the column being read while sensing the voltage level.

12. The NAND flash memory device of claim 10 wherein the predetermined voltage is provided by a voltage regulator circuit 13. A NAND flash memory device comprising:
    an array of memory cells arranged in accessible rows and columns, wherein each column of memory cells are coupled to an associated bit line; and
    control circuitry to perform a power-up operation on the memory in response to externally provided power, wherein the power-up operation comprises charging all column bit lines of first and second data pages of an array of the memory to a predetermined positive voltage level prior to initiating an array access operation.

14. The NAND flash memory device of claim 13 wherein the control circuitry performs a read operation on a column of the array of memory cells, wherein the read operation comprises sensing a voltage level of a bit line associated with the column being read, and charging the bit line to the predetermined voltage following sensing the voltage level of the bit line.

15. The NAND flash memory device of claim 13 wherein each memory cell of the array stores multiple bits of data using multiple voltage levels of the memory cell.

16. The NAND flash memory device of claim 13 wherein the control circuitry maintains a charge on first and second adjacent bit lines located adjacent to and on opposite lateral sides of the bit line associated with the column being read while sensing the voltage level.

17. The NAND flash memory device of claim 13 wherein the predetermined voltage is provided by a voltage regulator circuit.

* * * * *

UNITED STATES PATENT AND TRADEMARK OFFICE
CERTIFICATE OF CORRECTION

PATENT NO. : 7,436,708 B2  Page 1 of 1
APPLICATION NO. : 11/276480
DATED : October 14, 2008
INVENTOR(S) : Roohparvar It is certified that error appears in the above-identified patent and that said Letters Patent is hereby corrected as shown below:

In column 5, line 14, in Claim 1, delete "colunm" and insert -- column --, therefor.

In column 6, line 35, in Claim 12, after "circuit" insert -- . --.

Signed and Sealed this

Twenty-fourth Day of March, 2009

JOHN DOLL
*Acting Director of the United States Patent and Trademark Office*